United States Patent
Busi et al.

(10) Patent No.: US 9,514,844 B2
(45) Date of Patent: Dec. 6, 2016

(54) FAST AUTO SHIFT OF FAILING MEMORY DIAGNOSTICS DATA USING PATTERN DETECTION

(71) Applicant: INTERNATIONAL BUSINESS MACHINES CORPORATION, Armonk, NY (US)

(72) Inventors: Aravindan J. Busi, Karnataka (IN); Kevin W. Gorman, Fairfax, VT (US); Kiran K. Narayan, Hyderabad (IN); Michael R. Ouellette, Westford, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 119 days.

(21) Appl. No.: 14/468,999

(22) Filed: Aug. 26, 2014

(65) Prior Publication Data

US 2016/0064102 A1    Mar. 3, 2016

(51) Int. Cl.
*G11C 29/44* (2006.01)
*G11C 29/38* (2006.01)
*G01R 31/3193* (2006.01)
*G01R 31/3187* (2006.01)

(52) U.S. Cl.
CPC ........... *G11C 29/38* (2013.01); *G01R 31/3187* (2013.01); *G11C 29/44* (2013.01); *G01R 31/31935* (2013.01)

(58) Field of Classification Search
CPC ..... G11C 29/44; G11C 29/38; G01R 31/3187; G01R 31/31935
USPC ........................................................ 714/723
See application file for complete search history.

(56) References Cited

U.S. PATENT DOCUMENTS

| | | |
|---|---|---|
| 757,136 A | 4/1904 | Moest |
| 6,408,401 B1 * | 6/2002 | Bhavsar .............. G11C 29/006 714/6.2 |
| 6,701,476 B2 | 3/2004 | Pouya et al. |
| 6,910,155 B2 * | 6/2005 | Ku ..................... G01R 31/3187 714/30 |
| 6,978,408 B1 | 12/2005 | Huott et al. |
| 6,988,237 B1 * | 1/2006 | Solt .................... G06F 11/2215 714/763 |
| 7,171,596 B2 * | 1/2007 | Boehler ................ G11C 29/48 714/718 |
| 7,206,979 B1 | 4/2007 | Zarrineh et al. |

(Continued)

FOREIGN PATENT DOCUMENTS

JP    2009059434    3/2009

OTHER PUBLICATIONS

Karunaratne, et al.,"An Optimal Memory BISR Implementation", Journal of Computers, vol. 8, No. 9, Sep. 2013, pp. 2167-2174.

*Primary Examiner* — James C Kerveros
(74) *Attorney, Agent, or Firm* — Anthony Canale; Andrew M. Calderon; Roberts Mlotkowski Safran Cole & Calderon P.C.

(57) ABSTRACT

Logic and methods for diagnostic testing of memory and, more particularly, auto shift of failing memory diagnostics data using pattern detection are disclosed. The method includes detecting fails in the memory during a built in self test (BIST) pattern. The method further includes passing the fail information to a tester through a diagnostic pin. The method further includes pausing shift operations when it is determined that the shifting of the fail information is complete for the detected fail.

16 Claims, 7 Drawing Sheets

(56) References Cited

U.S. PATENT DOCUMENTS

| | | | |
|---|---|---|---|
| 7,206,984 B2 * | 4/2007 | Anzou | G01R 31/3187 714/719 |
| 7,237,154 B1 * | 6/2007 | Zorian | G11C 29/56008 714/711 |
| 7,278,060 B2 | 10/2007 | Jeddeloh | |
| 7,370,251 B2 * | 5/2008 | Nadeau-Dostie | G11C 29/40 714/723 |
| 7,386,777 B2 | 6/2008 | Volkerink et al. | |
| 7,421,636 B2 * | 9/2008 | Kang | G11C 29/14 714/718 |
| 7,444,564 B2 | 10/2008 | Anand et al. | |
| 7,493,541 B1 | 2/2009 | Agrawal et al. | |
| 7,516,363 B2 | 4/2009 | Jeddeloh | |
| 7,571,367 B2 | 8/2009 | Selva et al. | |
| 7,607,060 B2 | 10/2009 | Gorman et al. | |
| 7,730,369 B2 | 6/2010 | Cases et al. | |
| 7,797,599 B2 | 9/2010 | Khoche et al. | |
| 7,870,454 B2 | 1/2011 | Gorman et al. | |
| 7,882,407 B2 * | 2/2011 | Abu-Rahma | G11C 8/08 365/201 |
| 7,890,827 B2 | 2/2011 | Rajski et al. | |
| 8,037,376 B2 * | 10/2011 | Anzou | G11C 29/44 714/711 |
| 8,099,640 B2 | 1/2012 | Casarsa | |
| 8,127,184 B2 * | 2/2012 | Mohammad | G11C 29/44 714/723 |
| 2008/0007834 A1 | 1/2008 | Atsuta et al. | |
| 2011/0055646 A1 | 3/2011 | Mukherjee et al. | |
| 2013/0077421 A1 | 3/2013 | Wang et al. | |

* cited by examiner

FAST AUTO SHIFT OF FAILING MEMORY DIAGNOSTICS DATA USING PATTERN DETECTION

FIELD OF THE INVENTION

The invention relates to diagnostic testing of memory and, more particularly, to auto shift of failing memory diagnostics data using pattern detection.

BACKGROUND

Memory BIST (built in self test) is an important tool for testing memories (including finding/diagnosing and repairing defects within those memories). As more memory is integrated into chips, thorough BIST test and repair is a requirement in order to ensure reasonable product quality/reliability levels. Also, as the amount of memories per chip increases with each advancing technology node, the density of the memories also increases which in-turn raises the probability of detecting more fails. Due to the large amount of memory present in each chip, the number of fails detected are also significant.

Diagnostics is a process of extracting information about the failing address locations and failure scenarios. By analyzing this data, it is possible to understand the memory failure modes and improve the BIST patterns. This also helps a designer to allocate the redundancies more efficiently. All these efforts help improve the yields in each technology node.

The diagnostics process currently employed shifts the fail information serially to a tester. This process needs to be repeated for each fail and for every memory on the chip. This tends to be a tedious process and takes up a lot of tester time which is expensive. Hence, speeding up the diagnostics process improves the throughput of the tester significantly.

The BIST is usually run in 2 modes. The first mode is used to observe the fails and the second mode is used to shift out the observed fails on the DIAG pin. While running in the second mode, the BIST pauses at the observed FAIL address and shifts the data for 'n' clock cycles, which depends on the length of the diagnostics chain. Once the shift is complete, BIST resumes with normal operation until the next FAIL is detected. The bottleneck in the above method is that it tends to be a manual process. As it is necessary to observe the fails in the first pass, the user needs to program the BIST to select the failing memory and configure the BIST in pause mode and then correctly shift for 'n' cycles based on the memory configuration where the FAIL is detected.

SUMMARY

In an aspect of the invention, a method comprises detecting fails in a memory during a built in self test (BIST) pattern. The method further comprises passing the fail information to a tester through a diagnostic pin. The method further comprises pausing shift operations when it is determined that the shifting of the fail information is complete for the detected fail.

In an aspect of the invention, a method comprises initiating shifting of fail diagnostics data to a tester through a diagnostic pin when a fail is seen; and pausing shift operation when it is determined that the shifting of failing information is complete for the fail.

In an aspect of the invention, an architecture comprises a built in self test (BIST) engine which comprises: a diagnostic controller; and a diagnostic counter; and a diagnostic pin connecting to a tester. The architecture further comprises an SBIO module connecting to the BIST engine, which provides count information to the diagnostic counter which pauses shifting operations when a count value is met.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
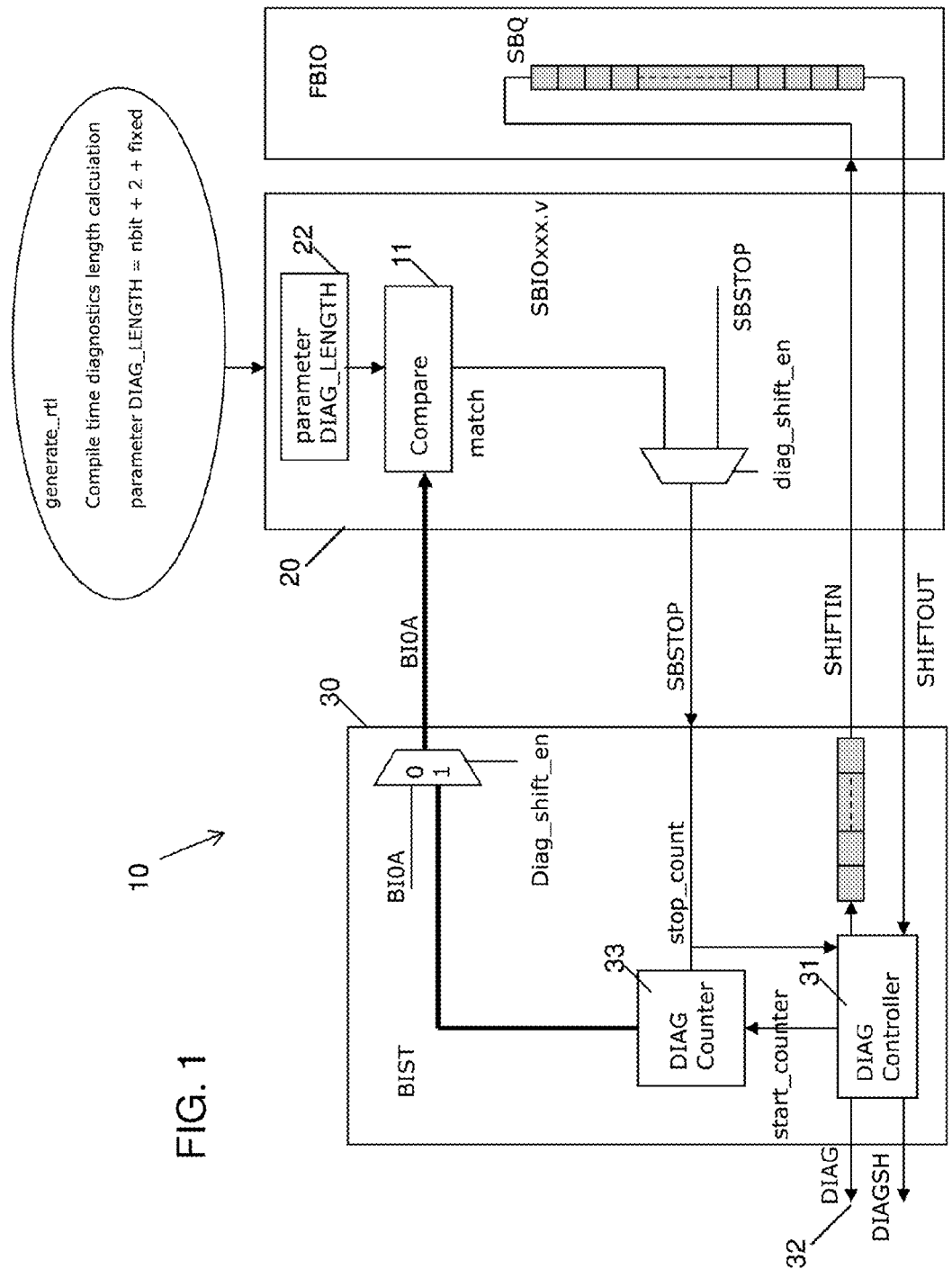
FIG. 1 shows an architecture/logic in accordance with aspects of the present invention.

The invention relates to logic and methods for diagnostic testing and, more particularly, to auto shift of failing memory diagnostics data using pattern detection. More specifically, the logic and methods provide a way to shift the correct number of bits for any configuration of the memory. For example, the present invention provides logic and methods that enable a BIST diagnostic system to automatically locate and select an appropriate memory instance for bit-mapping or other fail data logging to save test complexity and time. In embodiments, the logic includes a scheme for handling variable length diagnostic chains by encoding a BIST type string as a stop shifting command on the end of the chain. The logic can include a scheme for handing variable length diagnostic chains by reading a register that is programmed with the register length at design time.

In more specific embodiments, the architecture (logic) allows for automatically shifting of fail information through a DIAG (diagnostic) pin as soon as a FAIL is observed. Accordingly and advantageously, the logic and methods allow the BIST engine to observe the FAIL, identify the failing memory among the multiple memories connected to it and also shift out the failing information automatically without the user's intervention. The BIST engine also has logic to arbitrate among the failing memories in case of multiple fails. This saves a significant amount of test time and test pattern development/customization and enables faster diagnostics of the memory.

In current architectures, the BIST engine connects to the memories through BID (BIST ID) modules which handle the memory interface and detection of fails. These BID modules are unique based on the configuration of the bit width of the memory they are connected to. This makes fail mapping multiple memories at the same time difficult (due to the different diagnostic rotation shift cycles required). However, in the present invention, a BIST engine will enable a single memory for mapping/diagnostics in any one test pass and special test patterns that shift for the number of cycles that is correct for that specific memory instance. Hence, the current logic and methods can leverage the fact that a synthesizable BID logic is unique. In this case the information available about the memory configuration can be stored in the BID and used by the BIST engine to shift out the correct number of bits to the tester for each memory instance automatically.

In additional embodiments, the architecture (logic) allows for automatically shifting of FAIL information through the DIAG pin as soon as a FAIL is observed without the user having to program the control register to select the failing memory. In this architecture (logic) when a FAIL is seen, the BIST engine detects the failing memory among several memories connected to it, configures the control register to enable that memory for diagnostics and then shifts the data. To shift the data for an exact number of cycles, this aspect of the invention needs a fixed pattern set which is part of the diagnostic chain data, e.g., BIST type information. While shifting out the DIAG (diagnosis) chain data, the BIST continuously looks for the string of data matching the BIST type information. As soon as the BIST type information is observed, the BIST engine stops shifting out the data and resumes normal operation. The present invention also can defeat this mechanism so that BIST engine runs in the normal operation wherein it is possible to simply observe the fails and not log them. This helps in creating an ideal noise profile so that more memories on the chip run in parallel and detect weak memory cells.

FIG. 1 shows an architecture (logic) and a method for identifying a failing memory in accordance with aspects of the present invention. In this embodiment, the logic 10 implements a comparator 11 in SBIO (slow BIST I/O interfaces) module 20 to determine the end of shift and instruct a BIST engine 30 to stop the diagnostic shift operation. More specifically, the BIST engine 30 comprises a diagnostic controller 31 connected to a DIAG pin 32 which, in turn, is connected to a tester. The diagnostic controller 31 can thus pass fail information to the tester without pausing operations.

In embodiments, the diagnostic controller 31 can be a MUX connected to SHIFTIN and SHIFTOUT, each of which will fan into different SBIO modules 20. Although a single SBIO module is shown, it should be understood by those of skill in the art that a plurality of SBIO modules can be connected to and in communication with the BIST engine 30. The diagnostic controller 31 is a shift controller that asserts starts DIAG SHIFT and asserts "start_counter".

Still referring to FIG. 1, the BIST engine 30 further includes a diagnostic counter 33 which increments and sends a count value to the SBIO module 20 through BIOA pins on an address bus. The comparator 11, associated with the SBIO module 20, compares the value of the diagnostic counter 33 with a stored DIAG loop length, e.g., diagnostic length 22 (e.g., parameter DIAG_LENGTH) for the corresponding memory. Once a count value matches with the stored length, the comparator 11 asserts "stop_count", e.g., SBSTOP, which is sent to the BIST engine 30, e.g., diagnostic counter 33. The diagnostic counter 33 can then stop (pause) shift operations. It should be understood that SBIOxxx.v is unique for each memory size of a configurable RAM.

In embodiments, the stored diagnostic length is generated/calculated at compile time and accounts for the complete length of the diagnostics chain which includes a fixed number of bits in BIST engine. The fixed number of bits in BIST engine 30 indicates the state of the BIST logic at the time of detection of the fail, including the address, type of pattern and pattern state. The diagnostic length also includes the number of data bits for each word in the corresponding memory and any redundancy bits. By way of example, the diagnostic length is generated/calculated at compile time as follows: Compile time diagnostics length calculation parameter DIAGLENGTH=nbit+red bits+fixed.

Figure 2:
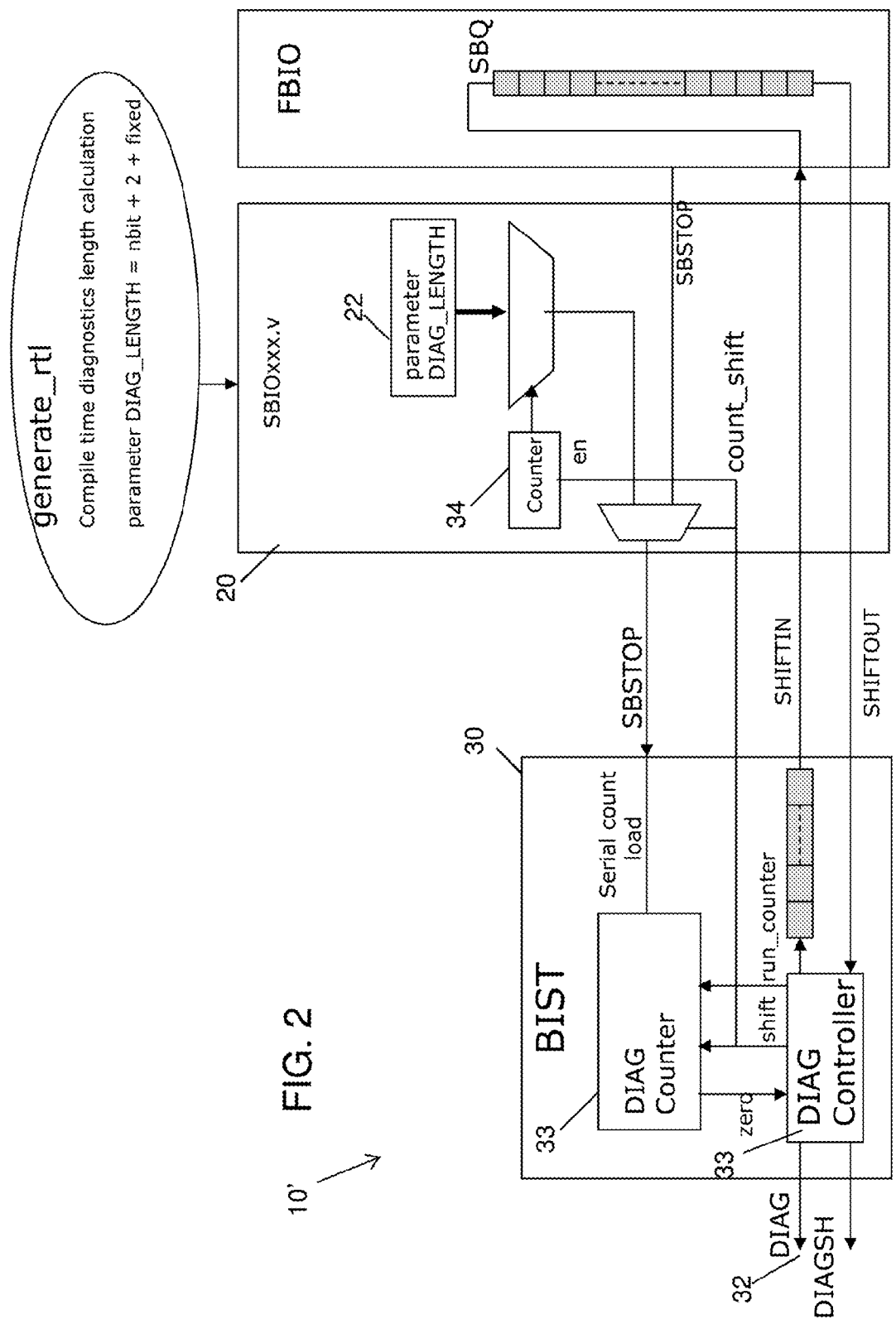
FIG. 2 shows an architecture/logic in accordance with additional aspects of the present invention.

FIG. 2 shows an architecture (logic) and a method for identifying a failing memory in accordance with additional aspects of the present invention. In this logic 10', the stored diagnostic length is also generated at compile time, which is counted down by diagnostic counter 33 in the BIST engine 30. The diagnostic counter 33 counts down from the shifted/programmed value to terminate the shift operation when it reaches zero. The advantage of controlling the diagnostics process in the BIST engine 30 is that there is no manual intervention from the tester; that is, the BIST engine 30 can sequentially shift out the diagnostic data for each memory automatically. The shifted diagnostics data will also include the information which identifies the failing memory.

Still referring to FIG. 2, the BIST engine 30 comprises the diagnostic controller 31 connected to a DIAG (diagnostic) pin 32 which, in turn, is connected to a tester. The diagnostic controller 31 can pass fail information to the tester without pausing operations. In embodiments, the diagnostic controller 31, e.g., DIAG shift controller, asserts "shift", and the diagnostic chain length calculated and stored in the SBIO module 20 is shifted into the diagnostic counter 33, e.g., DIAG Counter, by counter 34 in the SBIO module 20. The diagnostic controller 31 then asserts "run_counter" and starts shifting the DIAG data. The diagnostic counter 33 then starts decrementing and asserts "zero" when the counter 34 reaches "zero". The diagnostic controller 31 stops DIAG shift when "zero" is asserted. Once a count value is reached, e.g., decremented to zero, the SBIO module 20 asserts "stop_count", e.g., SBSTOP, which is sent to the BIST engine 30, e.g., diagnostic counter 33.

FIGS. 3-6 show flowcharts for implementing aspects of the present invention. More specifically, FIGS. 3-6 show flowcharts and implementations for diagnostics shift operation with the correct number of shifts in accordance with aspects of the present invention. The diagnostics shift operation can be implemented in the architectures of FIGS. 1 and 2 as described below.

Figure 3:
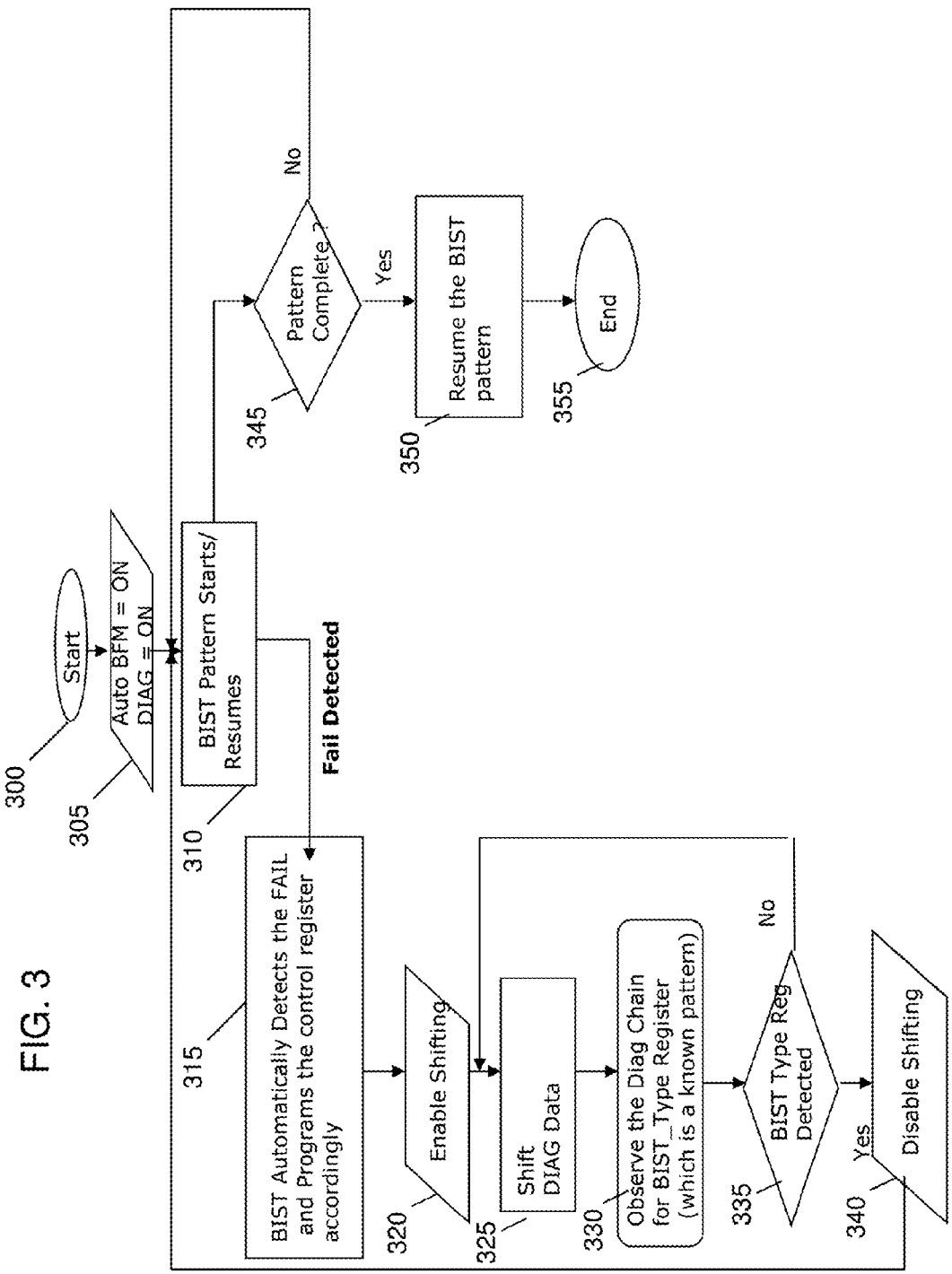
FIGS. 3-6 show flow charts for implementing aspects of the present invention.

In FIG. 3, for example, the BIST is run in AUTO BFM mode with DIAGNOSTICS enabled. When a fail is seen, the BIST engine pauses the simulation and detects the failing memory among the memories, e.g., 16 memories connected to the BIST engine. Then the control register is programmed to select that memory for diagnostic shifting and the shifting is started. More specifically, at step 300, the processes of the present invention start. At step 305, the auto BFM and diagnostics are turned on. At step 310, the BIST pattern starts or resumes. If a fail is detected, at step 315, the BIST engine automatically detects a fail and programs the control register accordingly. At step 320, the shift is enabled. At step 325, the diagnostic data is shifted. At step 330, the process observes the diagnostic change for BIST_type register, which is a known pattern. At step 335, a determination is made as to whether the BIST type register is detected. If no, the process reverts to step 325.

If a BIST type register is detected, then at step 340, the shifting is disabled and the process reverts to step 310. At step 310, if a fail is not detected, then at step 345, a determination is made as to whether the pattern is complete. If the pattern is not complete, the process reverts to step 310. If the pattern is complete, the process continues to step 350, where the BIST pattern is resumed. At step 355, the process ends.

Figure 4:
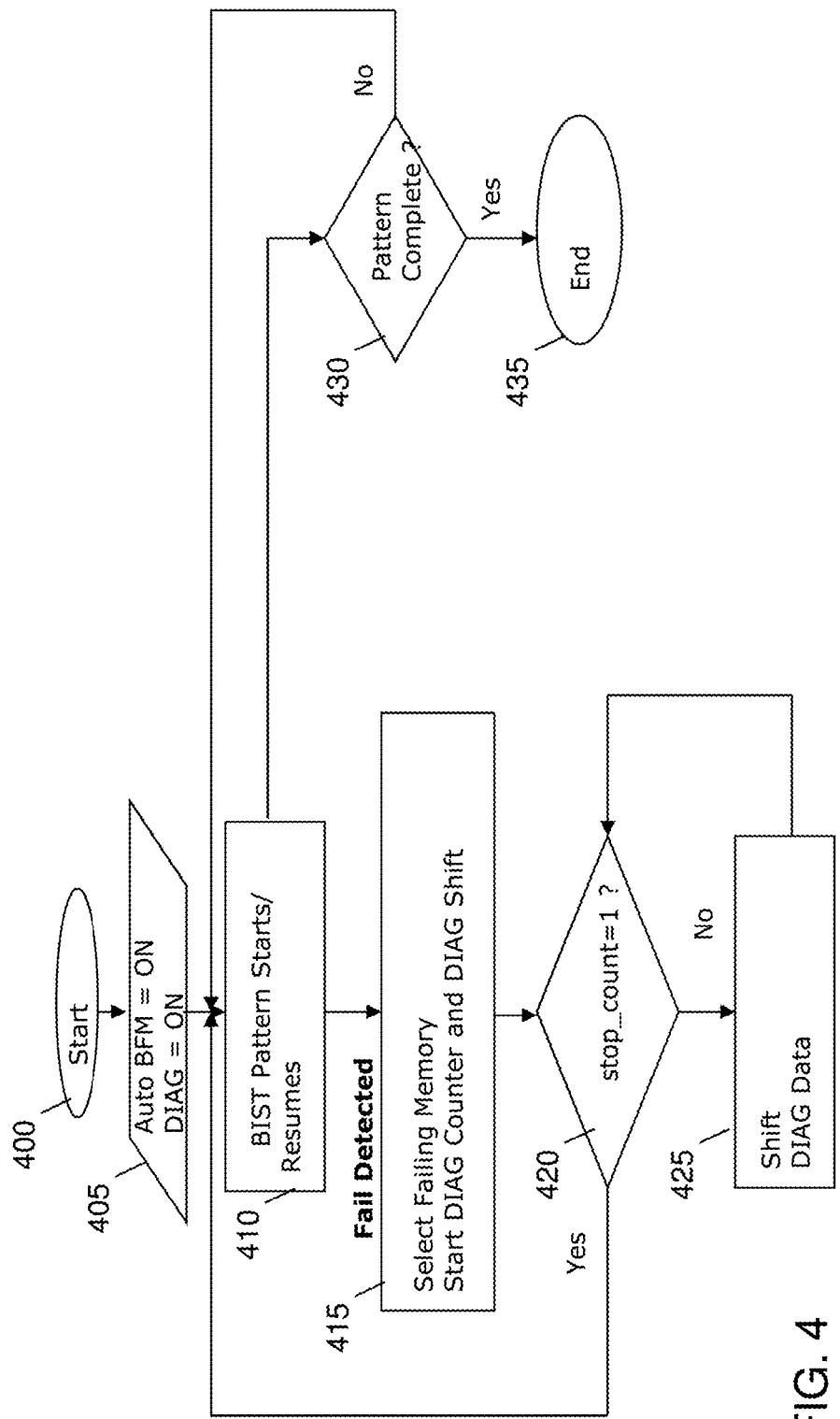

FIG. 4 shows an auto diagnostic method using the logic of FIG. 1. In embodiments, when a fail is detected, the diagnostic controller asserts the "start_counter" signal and starts shifting of diagnostics data on DIAG pin to the tester. The diagnostic counter starts up-counting when the "start_counter" is asserted and sends the count value to compare logic in SBIO module. The compare module asserts the "match" signal when the count value matches the pre-configured "DIAG_LENGTH" parameter. When the diagnostic controller sees the "stop_count" being asserted, the diagnostic shift is stopped. The counter also stops when the "stop_count" signal is asserted. The "diag_shift_en" signal is used to reuse the existing wiring between the BIST engine and SBIO module. This signal is generated by the diagnostic controller and will only be active during diagnostic shift. The DIAGSH signal indicates when the DIAG shift is in progress to the tester and the DIAG signal shift the DIAG Data.

More specifically, at step 400, the processes of the present invention start. At step 405, the auto BFM and diagnostics are turned on. At step 410, the BIST pattern starts or resumes. If a fail is detected, at step 415, the BIST engine will select a failing memory and start the diagnostic counter and diagnostic shifter. At step 420, a determination is made as to whether the STOP_COUNT is equal to 1. If the STOP_COUNT is equal to 1, the process reverts to step 410. If the STOP_COUNT is not equal to 1, the process continues to step 425. At step 425, the diagnostic data is shifted and the process reverts to step 420, where a determination is made as to whether the STOP_COUNT is equal to 1.

If a fail is not detected at step 410, the process continues to step 430 where a determination is made as to whether the pattern is complete. If the pattern is not complete, the process reverts to step 410. If the pattern is complete, the process ends at step 435.

Figure 5:
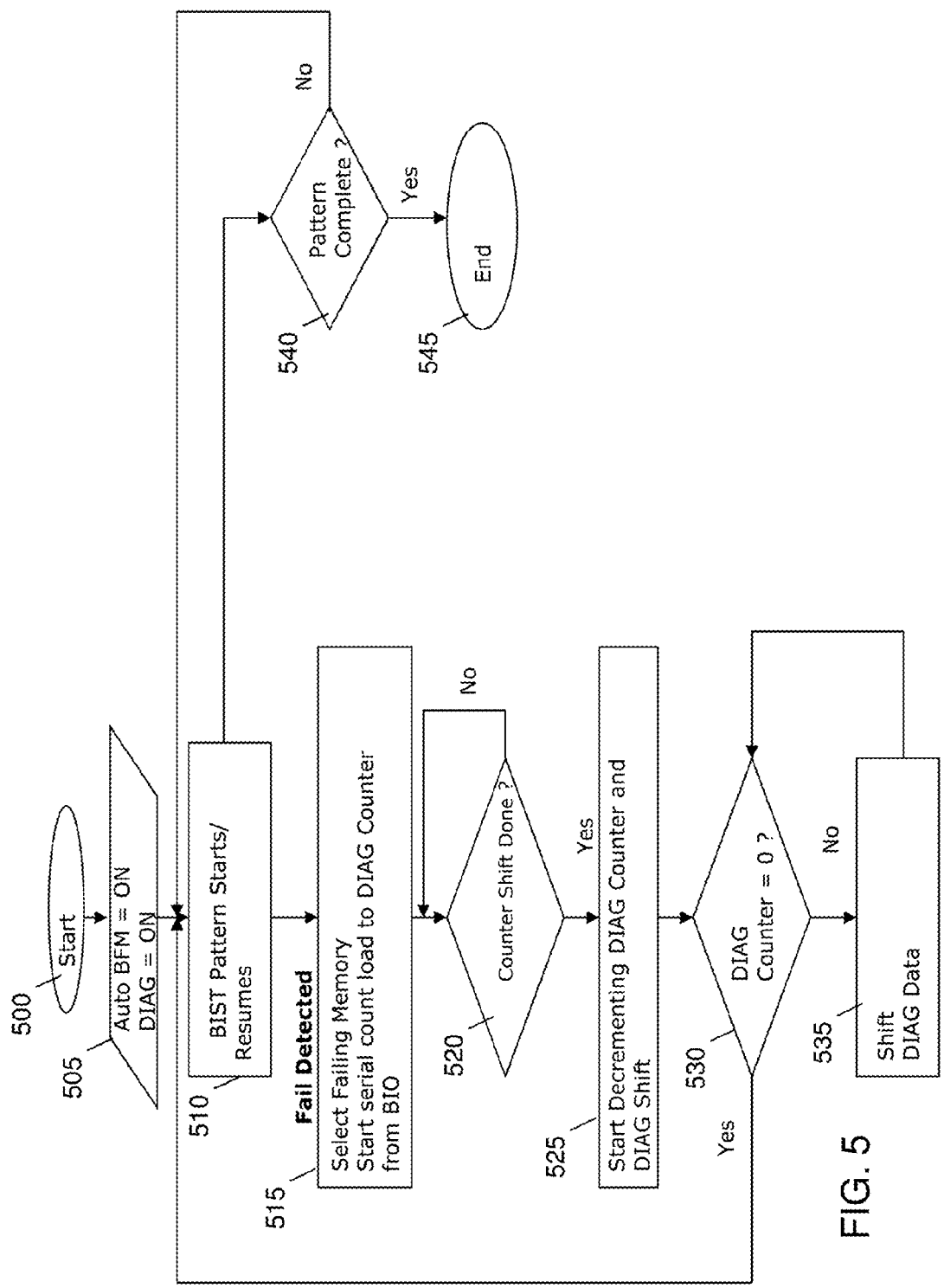

FIG. 5 shows an auto diagnostic method using the logic of FIG. 2. In this embodiment, the SBIO module configures the BIST by pre-programming the number of diagnostics shift cycles before the process begins. Illustratively, when a fail is detected, the diagnostic controller asserts the "shift" signal for a defined number of cycles. This represents the pre-programming phase. When the "count_shift" signal is asserted, the SBIO module shifts the DIAG_LENGTH parameter to the BIST serially, while the diagnostic counter loads the shifted value on to its counter register. The length of the parameter will be defined by the maximum DIAG chain length for each BIST Type. Once the shift phase is complete, the diagnostic controller de-asserts the "shift" signal and asserts the "run_counter" signal. The diagnostic controller also starts shifting out the diagnostic data on the DIAG pin simultaneously. The diagnostic counter starts decrementing counter from the pre-programmed DIAG_LENGTH value. When the counter reaches 0, the "zero" signal is asserted. The diagnostic controller stops the shift operation when it sees the "zero" signal asserted. The DIAGSH signal indicates when the DIAG shift is in progress to the tester and the DIAG signal shift the DIAG Data.

More specifically, at step 500, the processes of the present invention starts. At step 505, the auto BFM and diagnostics are turned on. At step 510, the BIST pattern starts or resumes. If a fail is detected, at step 515, the BIST engine will select a failing memory and start the serial counting load to the counter. At step 520, a determination is made as to whether the count shift is completed. If the count shift is not completed, the process loops back through step 520.

If the count shift is completed, the process continues to step 525. At step 525, the counter is decremented and diagnostic shift is started. At step 530, a determination is made as to whether the count is equal to zero. If the count is equal to zero, the process reverts to step 510. If the count is not equal to zero, the process continues to step 535 where the diagnostic data is shifted a bit. The process then reverts to step 530.

If a fail is not detected at step 510, the process continues to step 540, where a determination is made as to whether the pattern is complete. If the pattern is not complete, the process reverts to step 510. If the pattern is complete, the process ends at step 545.

Figure 6:
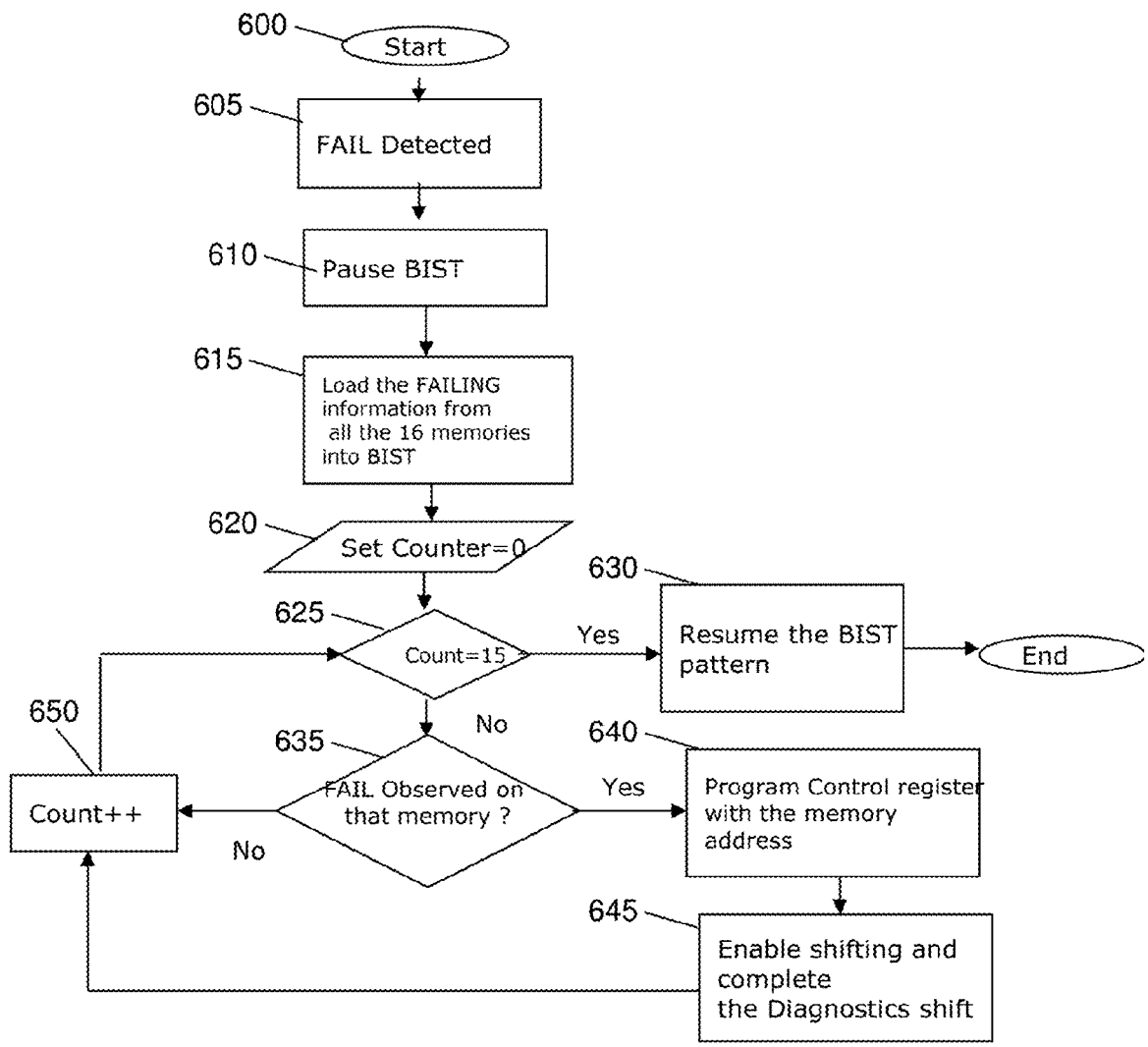

FIG. 6 shows an auto diagnostic method using the logic of either FIG. 1 or FIG. 2. The processes of FIG. 6 can be used to detect the failing memory among 16 memories connected to the BIST. In FIG. 6, all the FAIL signals coming from individual memories into the BIST are logically OR'ed. When a fail is detected, the BIST polls through each one of the memories, checking for fails. When a fail is found, the diagnostic shift process is started for the failing memory. This process does not require the tester to remember the failing memories and configure the BIST for diagnostics on each memory individually, which results in significant reduction of test time.

More specifically, at step 600, the process starts. At step 605, a fail is detected. At step 610, the BIST is paused. At step 615, the processes of the present invention load the failing information from all 16 memories into the BIST. At step 620, the counter is set to zero. At step 625, a determination is made as to whether the count is equal to "1". If so, at step 630, the BIST pattern is resumed.

If the counter is not equal to "1", the process continues to step 635. At step 635, a determination is made as to whether a fail is observed on the memory. If a fail is observed, then at step 640, the control register is programmed with the memory address. At step 645, the process enables shifting and the diagnostic shift is completed. The process then continues to step 650 for further counting. At step 635, if a fail is not observed, the process will continue to step 650.

Figure 7A:
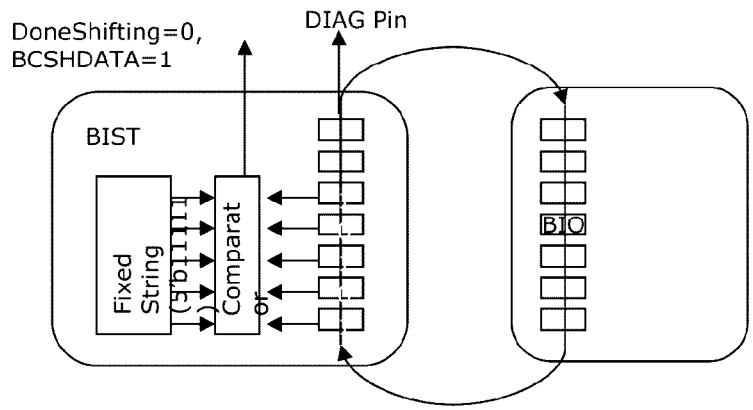
FIGS. 7a-7c are representative schematics of a shifting operation in accordance with aspects of the present invention.
Figure 7B:
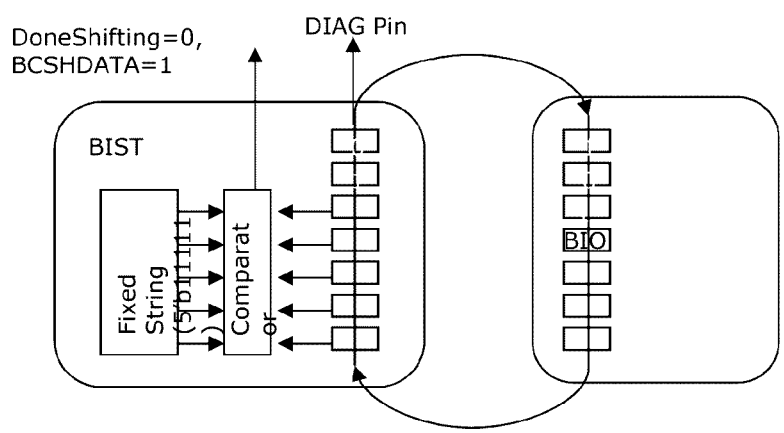
Figure 7C:
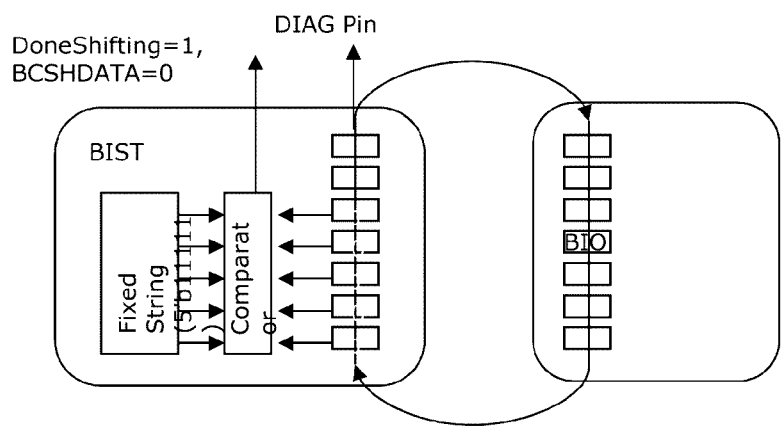

FIGS. 7a-7c are representative schematics of a shifting operation in accordance with aspects of the present invention. As shown in FIG. 7a, BIST observes the FAIL and starts shifting the FAIL. The DIAG chain goes across the BIST Engine and the 810 (BIST 10). BIOs are compilable and are grown according to the memory configuration attached to it. The diagnostic data contained in the BIO is the read data from the memory whose size varies with the memory configuration. Hence, it is preferable to know an exact count of the size of the memory to enable a proper diagnostic shift. The BIST has a fixed string of data which is part of the diagnostic chain stored in a register or can be stored using parameters (saving area). Here BIST Type information which is unique to a BIST can be used as the fixed string. The DONESHIFTING signal which can be used at the tester level is set to low while shifting so that the tester can log the data from the DIAG pin. BCSHDATA signal is enabled from the tester or on chip diagnostic controller to enable the shifting of the diagnostic data when a fail is detected.

In FIG. 7b, the data is being shifted across the diagnostic chain and the DONESHIFTING signal is still kept low for the tester to keep logging the data. BCSHDATA is held high during the shifting process. In FIG. 7c, the expected data which is the fixed string data that goes across the chain is observed in BIST. Once BIST observes the data which is equivalent to the Fixed String data, it stops shifting and enables the DONESHIFTING signal and indicates to the tester the diagnostic shifting is done and the tester can stop logging the data. The setup needs the fixed string data which can be in the form of BISTID to be stored either in registers or in the form of parameters and a comparator which is of the size of the fixed string. The comparator starts looking for data as soon as BCSHDATA goes high and enables when the pattern is observed.

In an aspect of the invention, the architecture comprises a pattern matching module in the BIST engine. The pattern matching module pauses shifting operations when a match is found for a fixed string during diagnostics data rotate. It should be understood by those of skill in the art that a diagnostics rotate or shift operation must return all the registers involved in diagnostics to their original state as before the shift or rotate started.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    detecting fails in a memory among multiple memories during a built in self test (BIST) pattern;
    arbitrating the fails among the multiple memories when multiple fails are detected;
    transferring fail information to a tester through a diagnostic pin;
    pausing shift operations when it is determined that the shifting of the fail information is complete for the detected fails,
    wherein
        a length of diagnostics data vary for different memory configurations;
    counting shift cycles of the diagnostics data during shift operations to determine when to pause the shift operations for the memory;
    wherein
        a diagnostic counter increments and sends a count value to an slow BIST I/O interface (SBIO) module;
    storing a diagnostic loop length for the memory in the SBIO module, the stored diagnostic loop length calculated by adding a fixed number of bits in a BIST engine which identifies a failing memory among the multiple memories, together with a number of data bits for each word in the memory and any redundancy bits,
    wherein
        the stored diagnostic loop length accounts for a complete length of a diagnostics chain, wherein the fixed number of bits indicate a state of a BIST logic at a time of detection of the fail and includes an address, a type of pattern, and a pattern state; and
    comparing by a comparator the count value of the diagnostic counter with the stored diagnostic loop length for the memory.

2. The method of claim 1, wherein the BIST engine identifies the failing memory among the multiple memories and connects to the multiple memories for shifting the diagnostics data.

3. The method of claim 1, wherein once the count value matches with the stored diagnostic loop length, the comparator asserts a stop_count signal which is sent to the diagnostic counter.

4. The method of claim 3, wherein the diagnostic counter disables shift operations when the value matches a zero.

5. The method of claim 1, wherein a diagnostic controller asserts a start_counter signal and starts shifting of diagnostics data on the diagnostic pin to the tester and the diagnostic counter starts up-counting and sends the count value to compare logic in an slow BIST I/O interface (SBIO) module.

6. The method of claim 1, wherein the stored diagnostic loop length is generated at compile time and counted down by the diagnostic counter in the BIST engine to determine when to pause the shifting operations.

7. The method of claim 1, wherein the diagnostic counter counts down from a programmed value to terminate the shift operation when it reaches zero.

8. The method of claim 1, wherein the BIST engine sequentially shifts out of diagnostic data for each memory automatically.

9. The method of claim 8, wherein the shifted diagnostics data includes information which identifies a failing memory.

10. The method of claim 1, further comprising counting to the stored diagnostic loop length and asserting a stop_count signal to stop shift operations when the counting reaches a value of the stored diagnostic loop length.

11. The method of claim 1, further comprising providing a unique fixed string in the BIST engine for pattern matching of diagnostics data.

12. The method of claim 1, further comprising stopping of shifting of the diagnostic data for failing memory when a fixed string pattern is detected or matched in the diagnostic data during a diagnostics rotate process.

13. A method, comprising:
    initiating a shifting of fail diagnostics data to a tester through a diagnostic pin when a fail is detected;
    storing a diagnostic loop length for the memory in an slow BIST I/O interface (SBIO) module, the stored diagnostic loop length calculated by adding a fixed number of bits in a BIST engine which identifies a failing memory among the multiple memories, together with a number of data bits for each word in the memory and any redundancy bits,
    wherein
        the stored diagnostic loop length accounts for a complete length of a diagnostics chain, wherein the fixed number of bits indicate a state of a BIST logic at a time of detection of the fail and includes an address, a type of pattern, and a pattern state; and pausing shift operation when it is determined that the shifting of failing information is complete for the fail by comparing a determined value with the stored diagnostic loop length.

14. An architecture, comprising:
a built in self test (BIST) engine comprising:
   a pattern matching module that pauses shifting operations when a match is found for a fixed string during a diagnostics data rotate;
   a diagnostic controller;
   a diagnostic counter;
   an SBIO module connecting to the BIST engine, which provides count information to the diagnostic counter which pauses the shifting operations when a count value is met; and
a diagnostic loop length for a memory and stored in the slow BIST I/O interface (SBIO) module, the stored diagnostic loop length calculated by adding a fixed number of bits in the BIST engine which identifies a failing memory among the multiple memories, together with a number of data bits for each word in the memory and any redundancy bits,
wherein
   the stored diagnostic loop length accounts for a complete length of a diagnostics chain, wherein the fixed number of bits indicate a state of a BIST logic at a time of detection of the fail and includes an address, a type of pattern, and a pattern state.

15. The architecture of claim 14, further comprising a comparator in the SBIO module to compare a count value of the diagnostic counter and the stored diagnostic loop length.

16. The architecture of claim 14, further comprising a counter in the SBIO module which provides a value to the diagnostic counter.

* * * * *